United States Patent
Choi et al.

(10) Patent No.: US 8,399,923 B2
(45) Date of Patent: Mar. 19, 2013

(54) HIGH VOLTAGE SEMICONDUCTOR DEVICE INCLUDING FIELD SHAPING LAYER AND METHOD OF FABRICATING THE SAME

(75) Inventors: Yong-cheol Choi, Paju-si (KR); Chang-ki Jeon, Gimpo-si (KR); Min-suk Kim, Bucheon-si (KR)

(73) Assignee: Fairchild Korea Semiconductor Ltd. (KR)

( * ) Notice: Subject to any disclaimer, the term of this patent is extended or adjusted under 35 U.S.C. 154(b) by 445 days.

(21) Appl. No.: 12/495,948

(22) Filed: Jul. 1, 2009

(65) Prior Publication Data
US 2010/0001343 A1 Jan. 7, 2010

(30) Foreign Application Priority Data
Jul. 4, 2008 (KR) .................. 10-2008-0065139

(51) Int. Cl.
*H01L 29/66* (2006.01)
(52) U.S. Cl. .............. 257/335; 257/336; 257/339
(58) Field of Classification Search .............. 257/335, 257/336, 339, 343, 408, 409, 493
See application file for complete search history.

(56) References Cited

U.S. PATENT DOCUMENTS

| | | | |
|---|---|---|---|
| 6,909,143 B2* | 6/2005 | Jeon et al. | 257/335 |
| 2003/0057459 A1* | 3/2003 | Rumennik | 257/288 |
| 2006/0057784 A1* | 3/2006 | Cai et al. | 438/149 |
| 2006/0226479 A1* | 10/2006 | Tu et al. | 257/341 |
| 2007/0090470 A1* | 4/2007 | Heringa | 257/409 |
| 2007/0120184 A1* | 5/2007 | Cai et al. | 257/335 |
| 2008/0001198 A1* | 1/2008 | Jeon et al. | 257/298 |
| 2009/0146137 A1* | 6/2009 | Kim et al. | 257/40 |
| 2010/0025756 A1* | 2/2010 | Fu et al. | 257/328 |
| 2010/0038676 A1* | 2/2010 | Heringa et al. | 257/168 |

* cited by examiner

*Primary Examiner* — Telly Green
(74) *Attorney, Agent, or Firm* — Cantor Colburn LLP

(57) ABSTRACT

Provided are a high voltage semiconductor device in which a field shaping layer is formed on the entire surface of a semiconductor substrate and a method of fabricating the same. Specifically, the high voltage semiconductor device includes a first conductivity-type semiconductor substrate. A second conductivity-type semiconductor layer is disposed on a surface of the semiconductor substrate, and a first conductivity-type body region is formed in semiconductor layer. A second conductivity-type source region is formed in the body region. A drain region is formed in the semiconductor layer and is separated from the body region. The field shaping layer is formed on the entire surface of the semiconductor layer facing the semiconductor layer.

11 Claims, 9 Drawing Sheets

HIGH VOLTAGE SEMICONDUCTOR DEVICE INCLUDING FIELD SHAPING LAYER AND METHOD OF FABRICATING THE SAME

CROSS-REFERENCE TO RELATED PATENT APPLICATIONS

This application claims the benefit of Korean Patent Application No. 10-2008-0065139, filed on Jul. 4, 2008, in the Korean Intellectual Property Office, the disclosure of which is incorporated herein in its entirety by reference.

BACKGROUND OF THE INVENTION

1. Field of the Invention

The present inventive concept relates to a high voltage semiconductor device, and more particularly, to a lateral diffusion metal oxide semiconductor (LDMOS) transistor device in which a field shaping layer is formed on the entire surface of a semiconductor substrate and a method of fabricating the same.

2. Description of the Related Art

In general, high voltage integrated circuits (HVICs) in which at least one high voltage transistor and low voltage circuits are formed in a single chip are used in, for example, power control systems, such as switching power suppliers or motor drivers. HVICs include a high voltage portion, a low voltage portion, and a junction termination portion disposed between the high voltage portion and the low voltage portion. The junction termination portion isolates the high voltage portion from the low voltage portion. Level-shifting devices for level-shifting a signal from the low voltage portion and providing it to the high voltage portion are arranged in the junction termination portion.

Examples of level-shifting devices include lateral diffusion metal-oxide semiconductor (LDMOS) transistors. LDMOS transistors should maintain high break-down-voltage and minimize on-resistance. To obtain these characteristics, LDMOS transistors having a reduced surface field (RE-SURF) are used.

In lateral diffusion metal-oxide semiconductor (LDMOS) transistors, a P-type top region that is used to reduce a surface field completely depletes a portion of an N-type epitaxial layer formed between a source region and a drain region, and thus, a high voltage-break-down-voltage can be obtained. In this regard, the P-type top region and the N-type epitaxial layer should strike a charge balance. If the P-type top region and the N-type epitaxial layer are completely depleted, in general, a high electric field is concentrated at a surface of the N-type epitaxial layer. When the high electric field is focused on the surface of the N-type epitaxial layer, recovery is impossible after break-down occurs, or semiconductor devices arranged on the N-type epitaxial layer are burned out. Also, the electric field focused on the surface of the N-type epitaxial layer causes deterioration of the semiconductor devices arranged on the N-type the epitaxial layer.

SUMMARY OF THE INVENTION

The present inventive concept provides a high voltage semiconductor device in which a field shaping layer is formed on the entire surface of a semiconductor substrate under an epitaxial layer, and a method of fabricating the same.

According to an aspect of the present inventive concept, there is provided a high voltage semiconductor device including a field shaping layer. The high voltage semiconductor device includes a first conductivity-type semiconductor substrate. A second conductivity-type semiconductor layer may be disposed on a surface of the semiconductor substrate, and a first conductivity-type body region may be formed in the semiconductor layer. A second conductivity-type source region may be formed in body region. A drain region may be separated from the body region and may be disposed in the semiconductor layer. A field shaping layer may be formed on the entire surface of the semiconductor substrate facing the semiconductor layer.

The field shaping layer may include a first conductivity-type impurity region. The impurity concentration of the field shaping layer may be higher than that of the semiconductor substrate. The high voltage semiconductor device may further include a first conductivity-type top region formed in a portion of the semiconductor layer between the body region and the drain region. The impurity concentration of the top region may be higher than that of the field shaping layer According to another aspect of the present inventive concept, there is provided a method of fabricating a high voltage semiconductor device. First, a field shaping layer is formed on the entire surface of a first conductivity-type semiconductor substrate. A second conductivity-type semiconductor layer may be formed on the field shaping layer. A first insulating layer may be formed on the semiconductor layer. A first conductivity-type body region may be formed in the semiconductor layer. A second insulating layer may be formed on the semiconductor layer except for portions of the semiconductor layer and a portion of the body region. A gate may be formed on a portion of the first insulating layer and a portion of the second insulating layer, wherein the gate overlaps a portion of the body region and a portion of the semiconductor layer. A second conductivity-type source region may be formed in the body region and a drain region in the body region, wherein the source region is separated from the drain region.

The field shaping layer may be formed by blanket ion-implanting first conductivity-type impurities into the semiconductor substrate. The method may further include forming the body region comprises forming a top region in a portion of the semiconductor layer between the source region and the drain region.

BRIEF DESCRIPTION OF THE DRAWINGS

The above and other features and advantages of the inventive concept will become more apparent by describing in detail exemplary embodiments thereof with reference to the attached drawings in which.

DETAILED DESCRIPTION OF THE INVENTION

Figure 1:
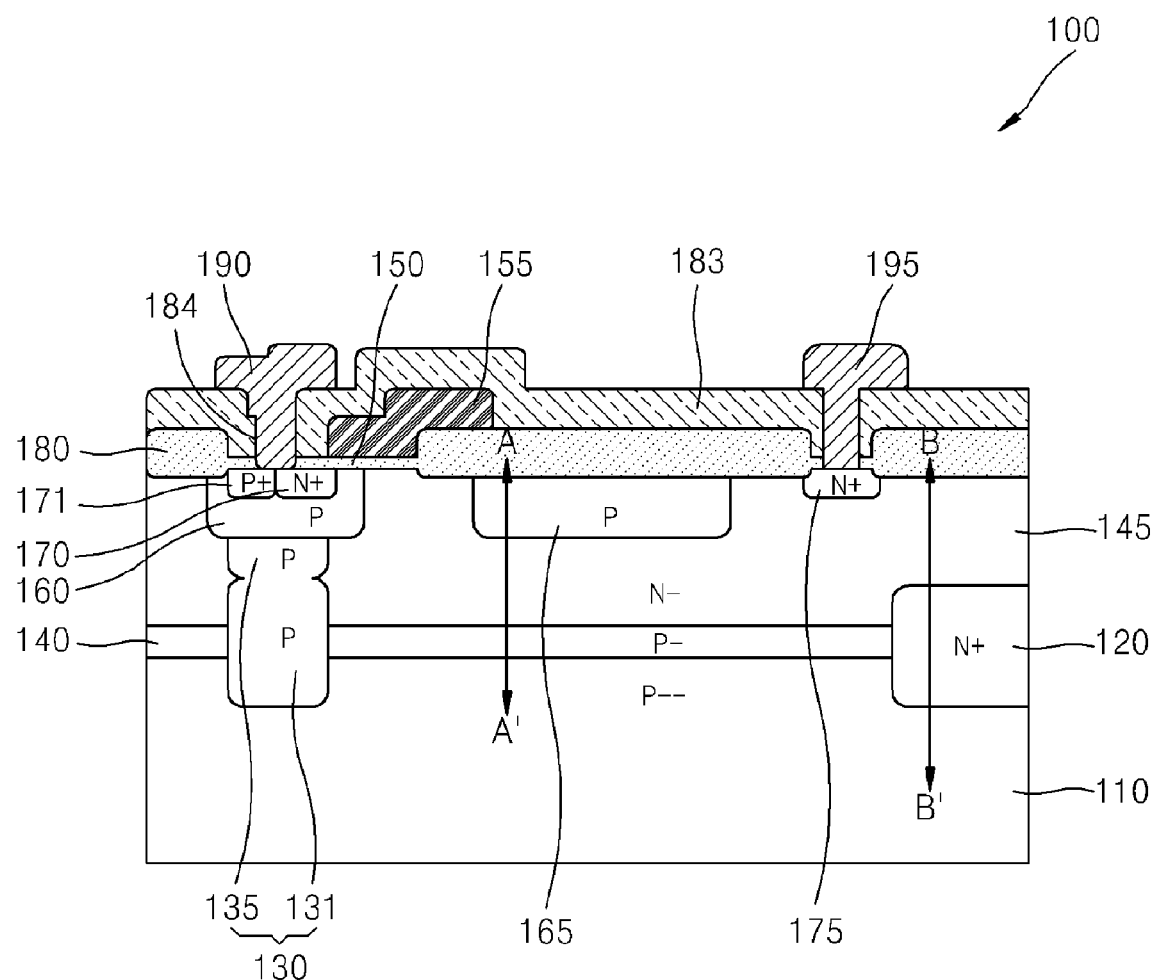
FIG. 1 is a sectional view of a high voltage semiconductor according to an embodiment of the present inventive concept.

The present inventive concept will now be described more fully with reference to the accompanying drawings, in which exemplary embodiments of the invention are shown. It will also be understood that when a layer is referred to as being "on" another layer or substrate, it can be directly on the other layer or substrate, or intervening layers may also be present.

The present inventive concept will now be described more fully with reference to the accompanying drawings, in which exemplary embodiments of the invention are shown. The inventive concept may, however, be embodied in many different forms and should not be construed as being limited to the embodiments set forth herein; rather, these embodiments are provided so that this disclosure will be thorough and complete, and will fully convey the concept of the inventive concept to those skilled in the art. In the drawings, the shapes of elements are exaggerated for clarity. Like reference numerals in the drawings denote like elements, and thus their description will be omitted.

FIG. 1 is a sectional view of a high voltage semiconductor device 100 according to an embodiment of the present inventive concept. Referring to FIG. 1, an epitaxial layer 145 is formed on a semiconductor substrate 110. The epitaxial layer 145 may have a second conductivity type, and in this regard, may be, for example, an $N^-$-type, and the semiconductor substrate 110 may have a first conductivity type, and in this regard, may be, for example, a $P^-$-type conductivity type. A device isolation region 130 isolates lateral diffusion metal oxide semiconductor (LDMOS) transistors. The device isolation region 130 may include: a bottom region 131 extending from the semiconductor substrate 110 to the epitaxial layer 145 through an interface between the semiconductor substrate 110 and the epitaxial layer 145; and a well region 135 formed between a top portion of the bottom region 131 and a top surface of the epitaxial layer 145. The bottom region 131 and the well region 135 may include a low-concentration first conductivity-type impurity region, and in this regard, may be, for example, a P-type impurity region.

A buried layer 120 may extend from the semiconductor substrate 110 to the epitaxial layer 145 through an interface between the semiconductor substrate 110 and the epitaxial layer 145, and is separated from the bottom region 131. The buried layer 120 may include a second conductivity-type impurity region, and in this regard, may be, for example, an $N^+$-type impurity region. A field shaping layer 140 is formed on the entire surface of the semiconductor substrate 110 facing the epitaxial layer 145. The impurity concentration of the field shaping layer 140 may be higher than that of the semiconductor substrate 110 and lower than that of the device isolation region 130. The field shaping layer 140 may include a $P^-$-type impurity region.

A body region 160 is formed on the well region 135, and a source region 170 is formed in the body region 160. The body region 160 may include a P-type impurity region, and the source region 170 may include a high-concentration second conductivity-type impurity region, and in this regard, may be, for example an $N^+$-type impurity region. A contact region 171 is formed in the body region 160 and contacts the source region 170. The contact region 171 may include a high-concentration first conductivity-type impurity region, and in this regard, may be, for example, a $P^+$-type impurity region. The contact region 171 may include a source contact region. A drain region 175 is formed in the epitaxial layer 145 and is separated from the source region 170. The drain region 175 may include a high-concentration second conductivity-type impurity region, and in this regard, may be, for example, an $N^+$-type impurity region. A top region 165 that is used to form a surface field is formed in a top portion of the epitaxial layer 145 between the source region 170 and the drain region 175. The top region 165 may include a first conductivity-type impurity region, and in this regard, may be, for example, a P-type impurity region. The top region 165 may have a higher impurity concentration than that of the field shaping layer 140.

A first insulating layer 150 is formed on a portion of the body region 160, a portion of the epitaxial layer 145 between the body region 160 and the top region 165, and portions of the drain region 175. A second insulating layer 180 is formed on a portion of the epitaxial layer 145 on which the first insulating layer 150 is not formed. The second insulating layer 180 is thicker and is to be used for device isolation. A gate 155 is formed on portions of the first insulating layer 150 and the second insulating layer 180 and overlaps a portion of the source region 170 and a portion of the top region 165. A portion of the first insulating layer 150 formed between the gate 155 and the epitaxial layer 145 may function as a gate insulating layer.

An interlayer insulating layer 183 is formed on the entire surface of the semiconductor substrate 110. The interlayer insulating layer 183 has contact holes 184 that expose portions of the contact region 171 and the source region 170, and a portion of the drain region 175. A source electrode 190 is formed on the interlayer insulating layer 183 and is electrically connected to the contact region 171 and the source region 170 through one of the contact holes 184. A drain electrode 195 is formed on the interlayer insulating layer 183 and is electrically connected to the drain region 175 through another of the contact holes 184.

Figure 2A:
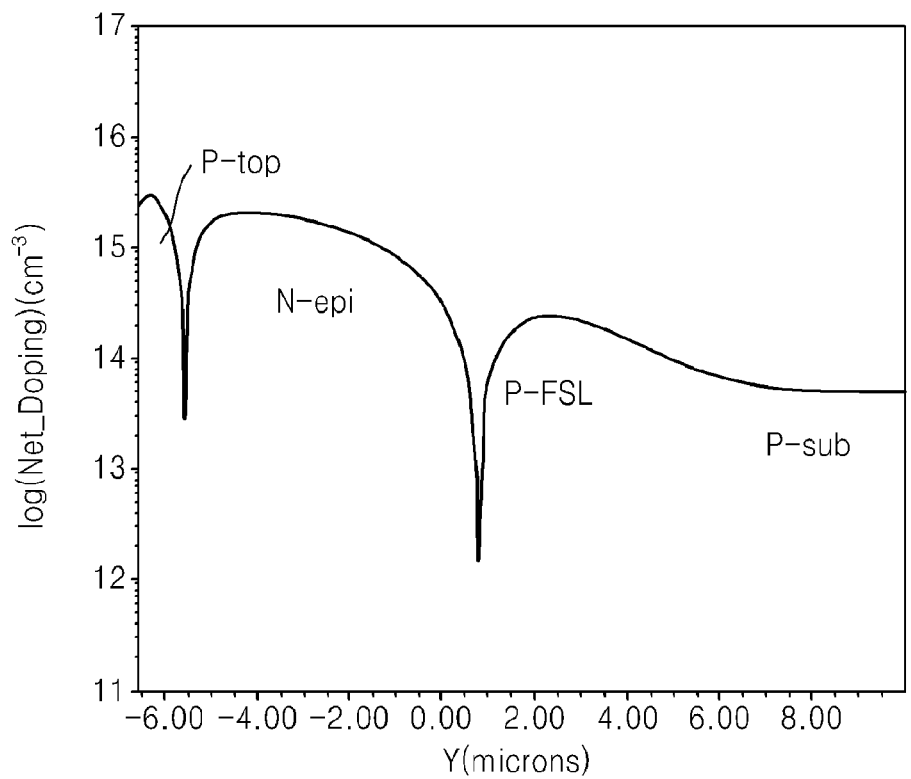
FIG. 2A is a graph of an impurity concentration distribution corresponding to a line A-A' of the high voltage semiconductor device of FIG. 1, when a field shaping layer is formed.
Figure 2B:
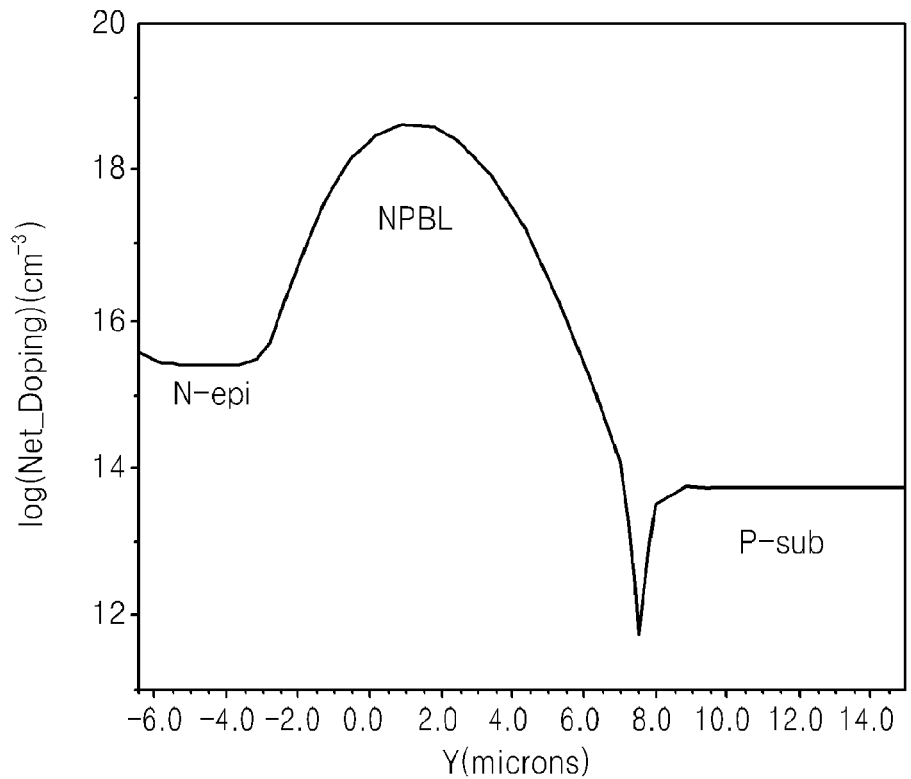
FIG. 2B is a graph of an impurity concentration distribution corresponding to a line B-B' of the high voltage semiconductor device of FIG. 1, when a field shaping layer is formed.
Figure 3A:
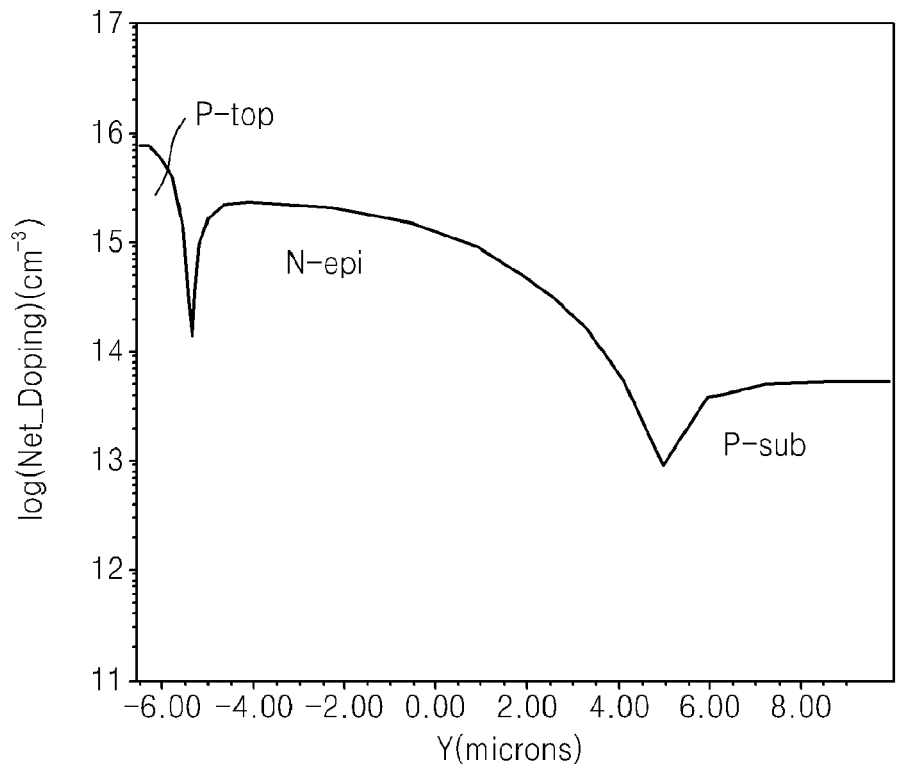
FIG. 3A is a graph of an impurity concentration distribution corresponding to the line A-A' of the high voltage semiconductor device of FIG. 1, when a field shaping layer is not formed.
Figure 3B:
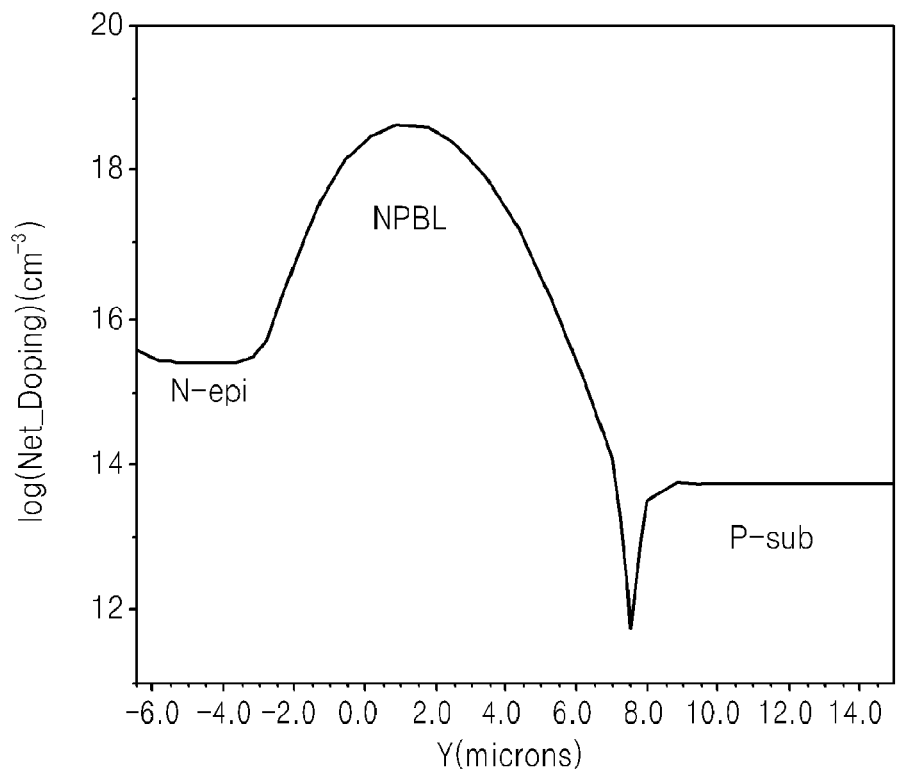
FIG. 3B is a graph of an impurity concentration distribution corresponding to the line B-B' of the high voltage semiconductor device of FIG. 1, when a field shaping layer is not formed.

FIG. 2A is a graph of an impurity concentration distribution corresponding to a line A-A' of the high voltage semiconductor device 100 of FIG. 1, when the field shaping layer 140 is formed; FIG. 2B is a graph of an impurity concentration distribution corresponding to a line B-B' of the high voltage semiconductor device 100 of FIG. 1, when the field shaping layer 140 is formed; FIG. 3A is a graph of an impurity concentration distribution corresponding to the line A-A' of the high voltage semiconductor device 100 of FIG. 1, when the field shaping layer 140 is not formed; and FIG. 3B is a graph of an impurity concentration distribution corresponding to the line B-B' of the high voltage semiconductor device 100 of FIG. 1, when the field shaping layer 140 is not formed. Referring to FIGS. 2A and 3A, when the field shaping layer 140 is not formed, the electric field is laterally formed by the top region 165 and when the field shaping layer 140 is formed, the electric field is more laterally formed by the top region 165 and the field shaping layer 140.

Referring to FIGS. 2B and 3B, since the buried layer 120 has the high-concentration $N^+$-type impurity region, even when the field shaping layer 140 of low-concentration $P^-$-type is formed on the entire surface of the semiconductor substrate 110, the impurity concentration distribution corresponding to the line B-B' is vertically formed between the buried layer 120 and the semiconductor substrate 110.

Figure 4A:
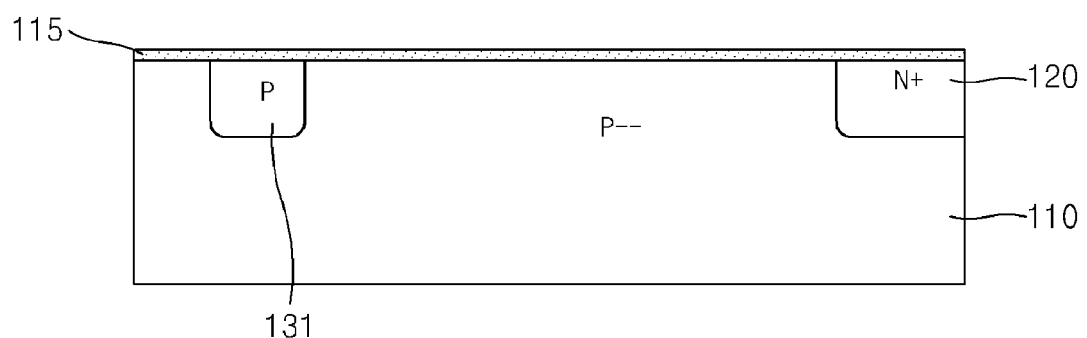
FIGS. 4A through 4I are sectional views illustrating a method of fabricating the high voltage semiconductor device of FIG. 1, according to an embodiment of the present inventive concept.

FIGS. 4A through 4J are sectional views illustrating a method of fabricating the high voltage semiconductor device 100 of FIG. 1, according to an embodiment of the present inventive concept. Referring to FIG. 4A, a pad insulating layer 115 is formed on a semiconductor substrate 110. The semiconductor substrate 110 may include a low-concentration first conductivity-type, and in this regard, may be, for example, a $P^-$-type. The pad insulating layer 115 may include a pad oxide layer formed using a thermal oxidization process. A first photosensitive layer (not shown) is formed on the pad insulating layer 115. The first photosensitive layer may expose a portion of the pad insulating layer 115 corresponding to a buried layer that is to be formed later. High-concentration second conductivity-type impurities are ion-implanted into the semiconductor substrate 110 using the first photosensitive layer as an ion implantation mask, thereby forming an $N^+$-type buried layer 120.

Then, the first photosensitive layer is removed and a second photosensitive layer (not shown) is formed on the pad insulating layer 115. The second photosensitive layer may expose a portion of the pad insulating layer 115 corresponding to a bottom region which is to be formed later. The bottom region may be used for device isolation. A first conductivity-type, for example, P type impurities are ion-implanted into the semiconductor substrate 110 using the second photosensitive layer as an ion implantation mask, thereby forming a bottom region 131 which is a P-type impurity region.

Figure 4B:
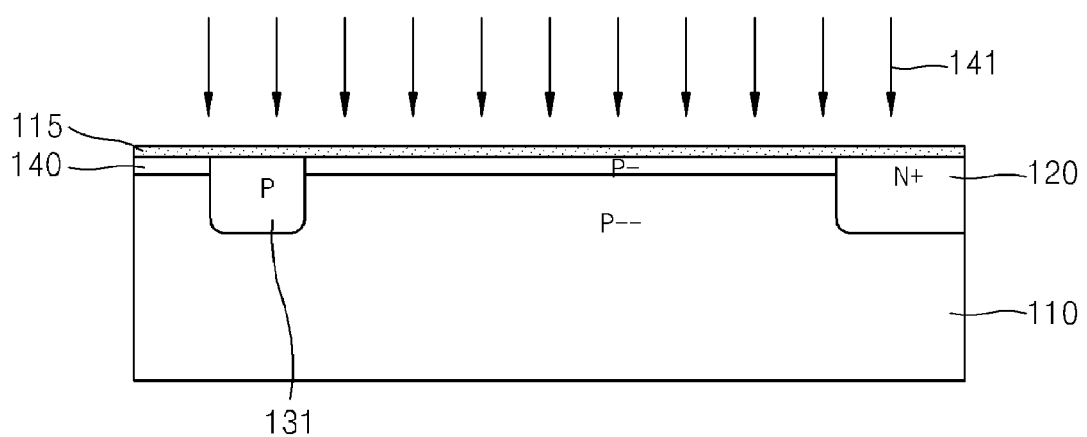

Referring to FIG. 4B, the second photosensitive layer is removed and a first conductivity-type impurities 141 are blanket ion-implanted into the semiconductor substrate 110, thereby forming a field shaping layer 140 on the entire surface of the semiconductor substrate 110. The impurity concentration of the field shaping layer 140 may be higher than that of the semiconductor substrate 110 and lower than that of the bottom region 131. The field shaping layer 140 may include a $P^-$-type impurity region.

Figure 4C:
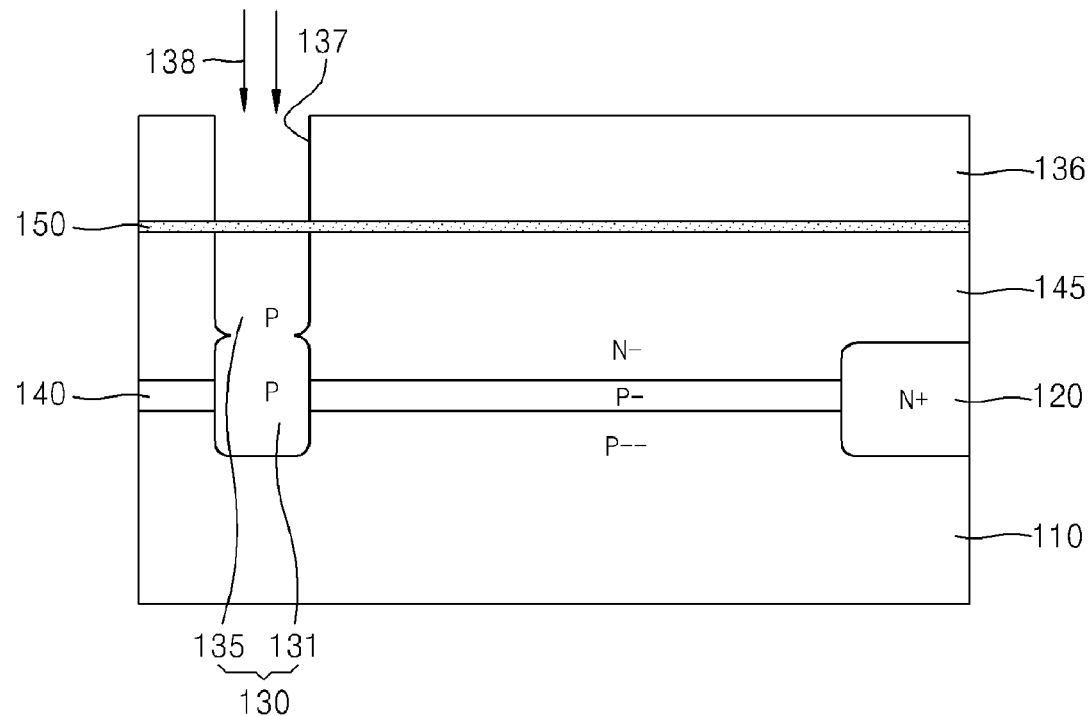

Referring to FIG. 4C, the pad insulating layer 115 is removed. An epitaxial layer 145 is formed on the semiconductor substrate 110. The epitaxial layer 145 may comprises a low-concentration second conductivity-type, and in this regard, may be, for example, an $N^-$-type. A first insulating layer 150 is formed on the epitaxial layer 145. The first insulating layer 150 may be a pad oxidization layer formed using a thermal oxidation process. A third photosensitive layer 136 is formed on the first insulating layer 150. The third photosensitive layer 136 may have an opening 137 exposing a portion of the first insulating layer 150 corresponding to the bottom region 131. Then, first conductivity-type impurities 138 are ion-implanted into the epitaxial layer 145 using the third photosensitive layer 136 as an ion implantation mask, thereby forming a well region 135 on the bottom region 131. The well region 135 may include a P type impurity region. Accordingly, a device isolation region 130 including the bottom region 131 and the well region 135 is formed.

Figure 4D:
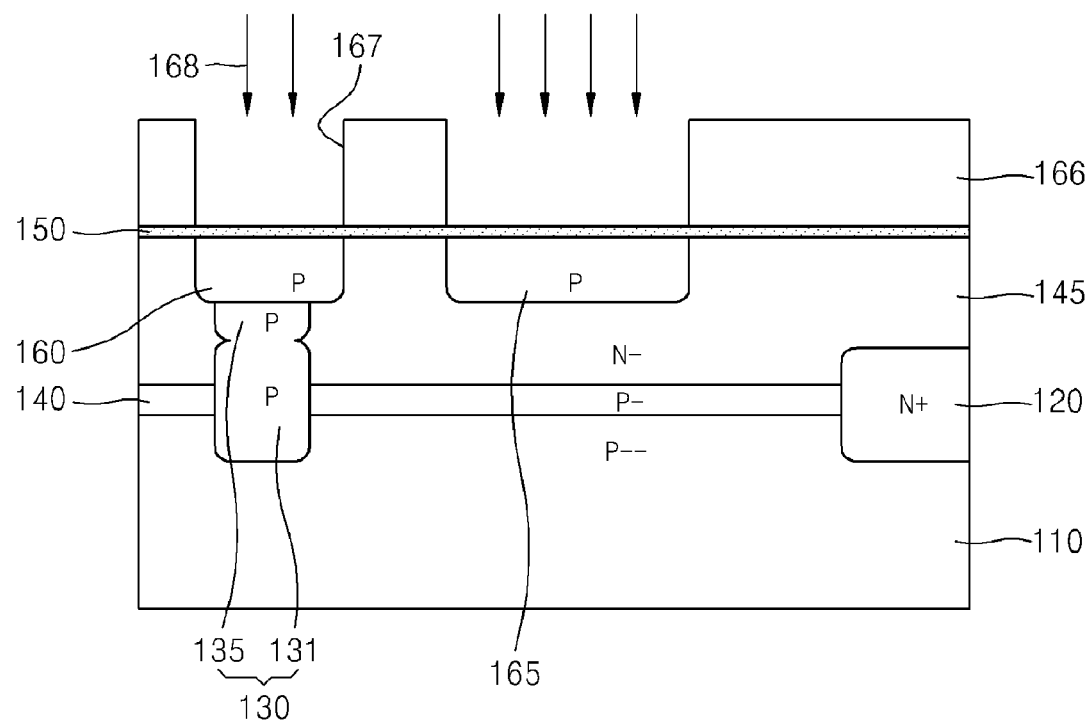

Referring to FIG. 4D, the third photosensitive layer 136 is removed and a fourth photosensitive layer 166 is formed on the first insulating layer 150. The fourth photosensitive layer 166 may have an opening 167 exposing portions of the first insulating layer 150 respectively corresponding to a body region and a top region which are to be formed later. A first conductivity-type impurities 168 are ion-implanted into the epitaxial layer 145 using the fourth photosensitive layer 166 as an ion implantation mask, thereby forming a body region 160 on the well region 135 and a top region 165 in the epitaxial layer 145 separated from the body region 160. The body region 160 may include a P-type impurity region, and the top region 165 may include a P-type impurity region.

Figure 4E:
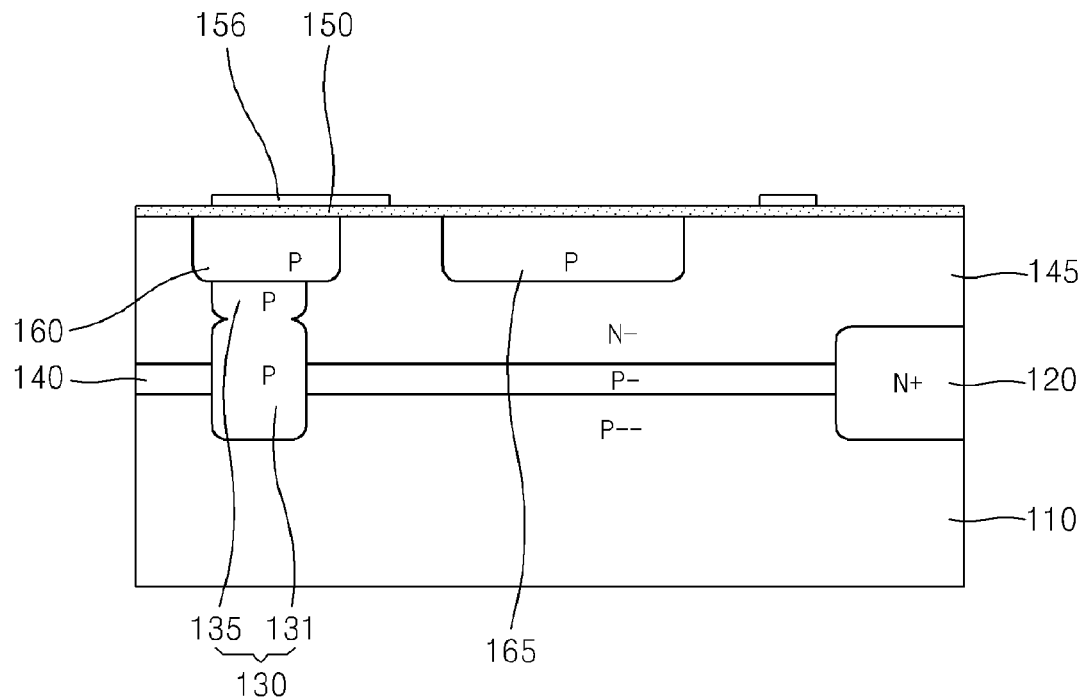
Figure 4F:
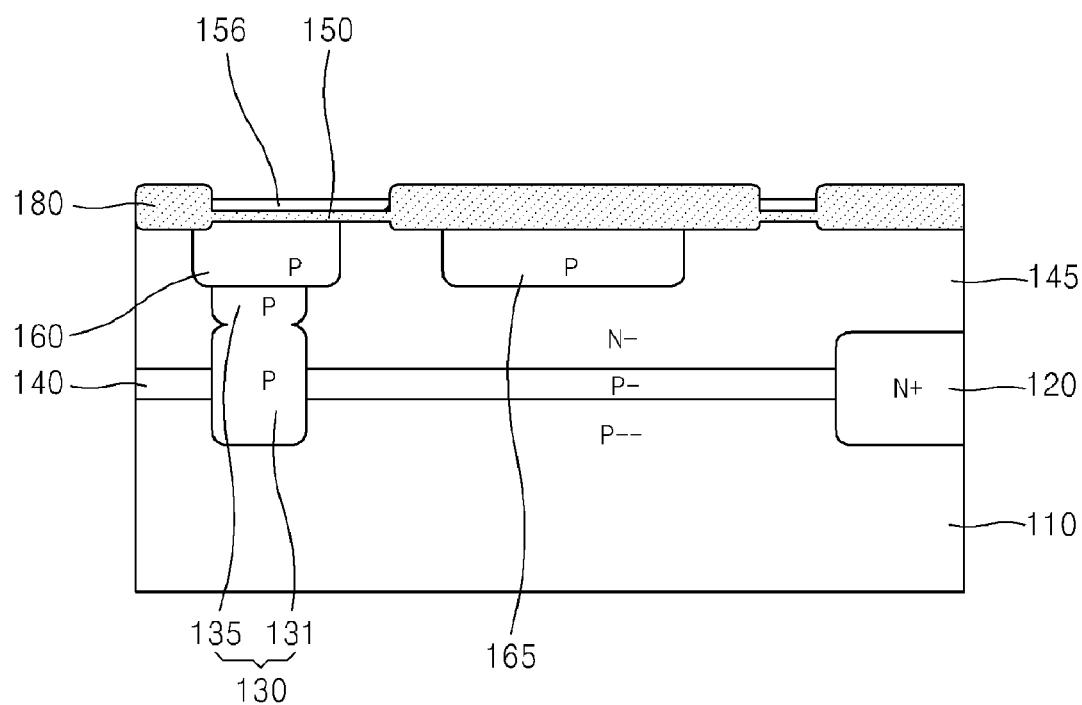

Referring to FIG. 4E, the fourth photosensitive layer 166 is removed and a nitride layer 156 that is to function as a mask in an oxidation process is formed on the first insulating layer 150. The nitride layer 156 exposes a portion of the first insulating layer 150 corresponding to a device isolation region that is to be formed. Referring to FIG. 4F, a second insulating layer 180 is formed to be thick on the epitaxial layer 145 by using a local oxidation of silicon structure (LOCOS) process. The second insulating layer 180 is formed on the epitaxial layer 145 except for a portion of the epitaxial layer 145 on which contact holes and a gate are disposed to be formed later.

Figure 4G:
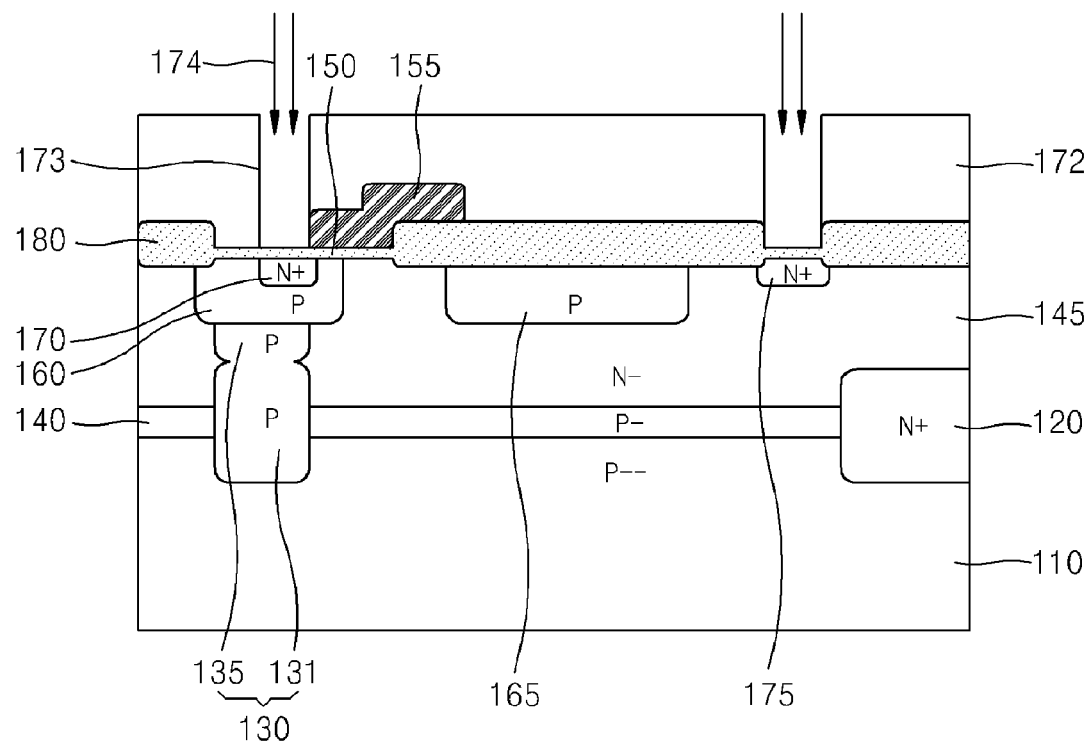

Referring to FIG. 4G, the nitride layer 156 is removed and a conductive layer is formed on the first insulating layer 150 and the second insulating layer 180. The conductive layer is patterned to form a gate 155 on the first insulating layer 150 and the second insulating layer 180. The gate 155 may overlap the body region 160 and the top region 165. The conductive layer may include a polysilicon layer.

Then, a fifth photosensitive layer 172 may be formed on the resultant structure. The fifth photosensitive layer 172 may have openings 174 that expose a portion of the first insulating layer 150 corresponding to a portion of the body region 160 that is to be formed to be a source region later and a portion of the first insulating layer 150 corresponding to a portion of the epitaxial layer 145 that is to be formed to be a drain region later. High-concentration second conductivity-type impurities 174 are ion-implanted into the body region 160 and the epitaxial layer 145 using the fifth photosensitive layer 172 as an ion implantation mask, thereby forming a source region 170 in the body region 160 and a drain region 175 in the epitaxial layer 145, wherein the source region 170 and the drain region 175 are disposed in such a way that the top region 165 is interposed therebetween. The source region 170 may include an $N^+$-type impurity region, and the drain region 175 may include an $N^+$-type impurity region.

Figure 4H:
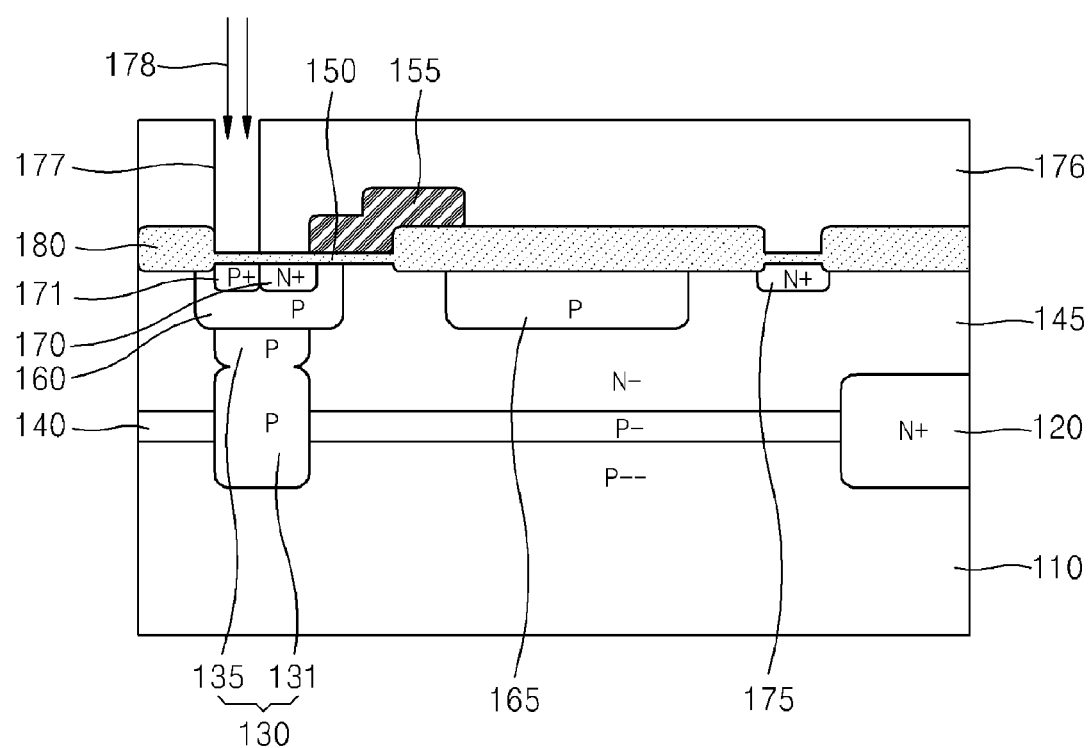

Referring to FIG. 4H, the fifth photosensitive layer 172 is removed, and a sixth photosensitive layer 176 is formed on the first insulating layer 150 and the second insulating layer 180. The sixth photosensitive layer 176 may have an opening 177 exposing a portion of the first insulating layer 150 corresponding to a portion of the body region 160 that contacts the source region 170. A high-concentration first conductivity-type impurity 178 is ion-implanted into the body region 160 using the sixth photosensitive layer 176 as an ion implantation mask, thereby forming a contact region 171 facing the source region 170 in the body region 160. The contact region 171 may include a $P^+$-type impurity region.

Figure 4I:
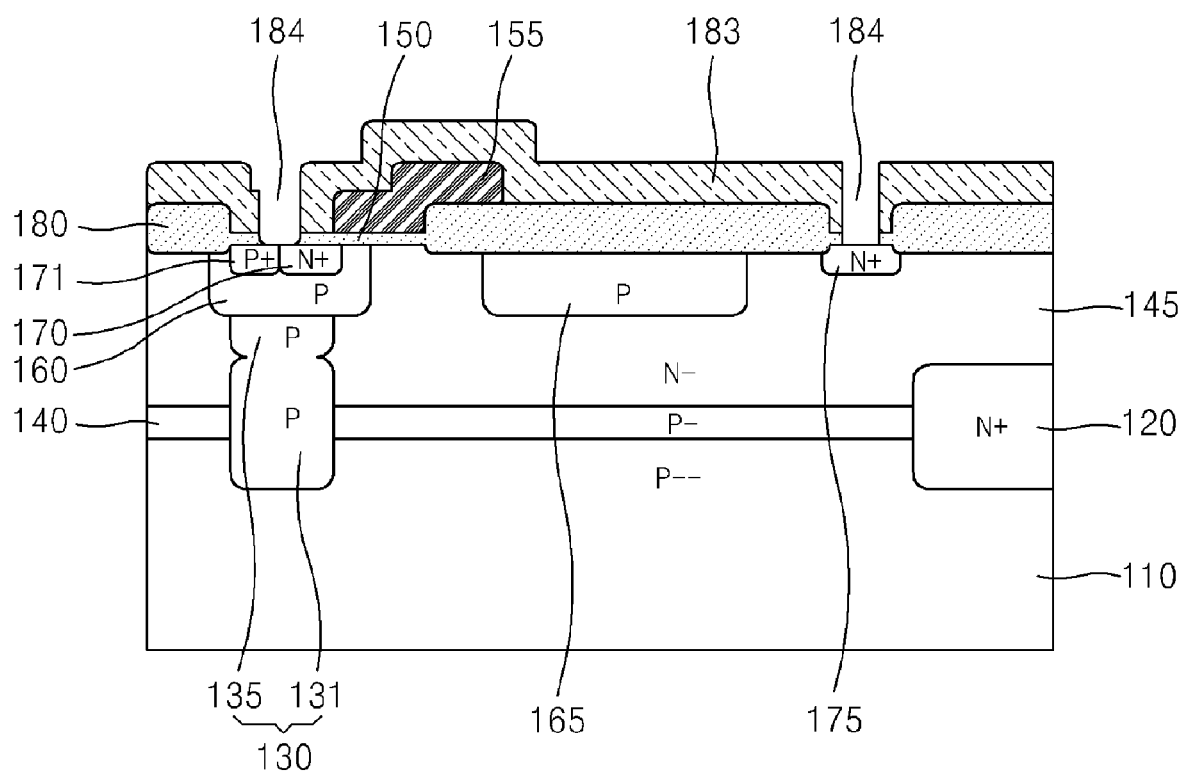

Referring to FIG. 4I, the sixth photosensitive layer 176 is removed. Then, an interlayer insulating layer 183 is formed on the resultant structure. The interlayer insulating layer 183 and the first insulating layer 150 are etched to form contact holes 184. The contact holes 184 expose a portion of the source region 170, a portion of the contact region 171, and a portion of the drain region 175. Then, as illustrated in FIG. 1, a source electrode 190 and a drain electrode 195 are formed on the interlayer insulating layer 183 by using a metal interconnection process, wherein the source electrode 190 is electrically connected to the source and contact regions 170 and 171 through one of the contact holes 184, and the drain electrode 195 is electrically connected to the drain region 175 through another of the contact holes 184.

Figure 5:
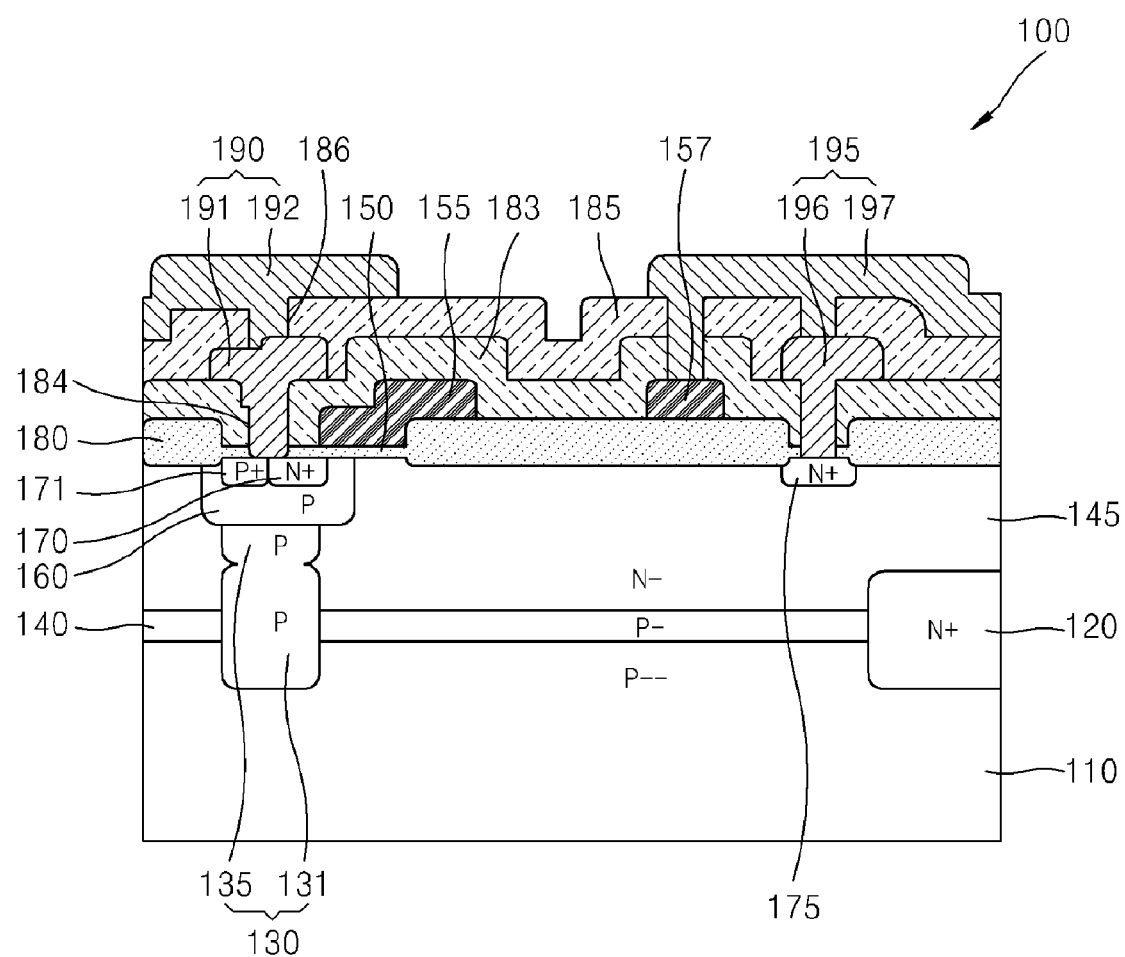
FIG. 5 is a sectional view of a high voltage semiconductor according to another embodiment of the present inventive concept.

FIG. 5 is a sectional view of a high voltage semiconductor device 100 according to another embodiment of the present inventive concept. Referring to FIG. 5, a field shaping layer 140 is formed on the entire surface of a semiconductor substrate 110 facing an epitaxial layer 145, and each of a source electrode 190 and a drain electrode 195 has a multi-layer structure. A first interlayer insulating layer 183 is formed on the resultant structure. The first interlayer insulating layer 183 has contact holes 184 that expose a portion of a contact region 171, a portion of a source region 170, and a portion of a drain region 175. The source electrode 190 includes a bottom source electrode 191 and a top source electrode 192, and the drain electrode 195 includes a bottom drain electrode 196 and a top drain electrode 197.

The bottom source electrode 191 and the bottom drain electrode 196 are formed on the first interlayer insulating layer 183. The bottom source electrode 191 is electrically connected to the contact region 171 and the source region 170 through one of the contact holes 184. The bottom drain electrode 196 is electrically connected to the drain region 175 through another of the contact holes 184. A conductive layer pattern 157 may be disposed on the second insulating layer 180. The top drain electrode 197 is electrically connected to the conductive layer pattern 157 through a second contact hole 186. The conductive layer pattern 157 may include a gate forming material.

A second interlayer insulating layer 185 is formed on the bottom source electrode 191, the bottom drain electrode 196, and the first interlayer insulating layer 183. The second interlayer insulating layer 185 has second contact holes 186 exposing a portion of the bottom source electrode 191 and a portion of the bottom drain electrode 196. The top source electrode 192 and the top drain electrode 197 are formed on the second interlayer insulating layer 185. The top source electrode 192 and the top drain electrode 197 are electrically connected to the bottom source electrode 191 and the bottom drain electrode 196 through the second contact holes 186, respectively. The top drain electrode 197 may be further electrically connected to the conductive layer pattern 157 through the third contact hole 187.

When the field shaping layer 140 is formed on the entire surface of the semiconductor substrate 110 and the top region (165 of FIG. 1) is not formed, as illustrated in the high voltage semiconductor device 100 of FIG. 5, the impurity concentration of the field shaping layer 140 illustrated in FIG. 5 may be higher than that of the field shaping layer 140 illustrated in FIG. 1 in order to strike a charge balance between the field shaping layer 140 and the epitaxial layer 145. On the other hand, when the top region 165 and the field shaping layer 140 co-exist as illustrated in the high voltage semiconductor device 100 of FIG. 1, the impurity concentration of the top region 165 and the impurity concentration of the field shaping layer 140 can be controlled as long as a charge balance between the field shaping layer 140 and the epitaxial layer 145 is achieved.

According to a high voltage semiconductor device and a method of fabricating the same according to embodiments of the present inventive concept, a field shaping layer is formed on the entire surface of a semiconductor substrate facing an epitaxial layer so that an electric field can be dispersed extending from the surface of the epitaxial layer to the bulk of the semiconductor substrate, thereby preventing the electric field from being focused on the surface of the epitaxial layer. Also, since breakdown occurs only in the bulk of the semiconductor substrate, the high voltage semiconductor device can be recovered, and since the electric field is not focused on the surface of the epitaxial layer, complete destruction of semiconductor devices arranged on the epitaxial layer can be prevented. In addition, since the field shaping layer is formed by performing a blanket ion implantation into the entire surface of the semiconductor substrate before the epitaxial layer is formed, a separate mask process for forming the field shaping layer is not needed.

While the present inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A high voltage semiconductor device comprising:
    a first conductivity-type semiconductor substrate;
    a second conductivity-type semiconductor layer disposed on a surface of the semiconductor substrate;
    a first conductivity-type body region formed in the semiconductor layer;
    a second conductivity-type source region formed in body region;
    a drain region that is separated from the body region and is disposed in the semiconductor layer; and
    a field shaping layer formed on substantially the entire surface of the semiconductor substrate facing the semiconductor layer at an interface between the semiconductor substrate and the semiconductor layer, wherein the field shaping layer comprises a first conductivity-type impurity region having an impurity concentration higher than that of the semiconductor substrate.

2. The high voltage semiconductor device of claim 1, further comprising:
    a device isolation region formed in a portion of the semiconductor layer under the body region and in the semiconductor substrate; and
    a second conductivity-type buried layer that is separated from the device isolation region and extends from the semiconductor substrate to the semiconductor layer through the interface between the semiconductor substrate and the semiconductor layer.

3. The high voltage semiconductor device of claim 2, wherein the device isolation region comprises a first conductivity-type impurity region.

4. The high voltage semiconductor device of claim 3, wherein the device isolation region comprises:
    a bottom region extending from the semiconductor substrate to the semiconductor layer through the interface between the semiconductor substrate and the semiconductor layer; and
    a well region extending from a top portion of the semiconductor layer to the body region.

5. The high voltage semiconductor device of claim 2, wherein the impurity concentration of the first conductivity-type impurity region of the field shaping layer is lower than that of the device isolation region.

6. The high voltage semiconductor device of claim 1, further comprising a first conductivity-type top region formed in a portion of the semiconductor layer between the body region and the drain region.

7. The high voltage semiconductor device of claim 6, wherein an impurity concentration of the first conductivity-type top region is higher than that of the field shaping layer.

8. The high voltage semiconductor device of claim 6, further comprising:
    a first conductivity-type contact region that contacts the source region and is disposed in the body region;
    a first insulating layer disposed on a portion of the body region, portions of the drain region, and a portion of the semiconductor layer between the first conductivity-type top region and the body region;
    a second insulating layer disposed on the semiconductor layer except for a portion of the semiconductor layer on which the first insulating layer is formed;
    a gate that is disposed on a portion of the first insulating layer and a portion of the second insulating layer and overlaps a portion of the source region and a portion of the first conductivity-type top region;

a source electrode electrically connected to the contact region and the source region; and a drain electrode electrically connected to the drain region.

9. The high voltage semiconductor device of claim 8, further comprising:

a bottom interlayer insulating layer that has first contact holes and is disposed on the first insulating layer and the second insulating layer; and a top interlayer insulating layer that has second contact holes and is disposed on the bottom interlayer insulating layer, wherein a third contact hole is formed over the bottom and top interlayer insulating layers.

10. The high voltage semiconductor device of claim 9, wherein the source electrode comprises:

a bottom source electrode that is disposed on the bottom interlayer insulating layer and is electrically connected to the contact region and the source region through one of the first contact holes; and a top source electrode that is disposed on the top interlayer insulating layer and is electrically connected to the bottom source electrode through one of the second contact holes.

11. The high voltage semiconductor device of claim 10, wherein the drain electrode comprises:

a conductive layer pattern that is disposed on the second insulating layer;

a bottom drain electrode that is disposed on the bottom interlayer insulating layer and is electrically connected to the drain region through another first contact hole; and a top drain electrode that is disposed on the top interlayer insulating layer and is electrically connected to the bottom drain electrode through another second contact hole and to the conductive layer pattern through the third contact hole.

* * * * *